United States Patent [19]

Joh

[11] Patent Number: 5,580,804

[45] Date of Patent: Dec. 3, 1996

[54] METHOD FOR FABRICATING TRUE LDD DEVICES IN A MOS TECHNOLOGY

[75] Inventor: Dae Y. Joh, Los Altos, Calif.

[73] Assignee: Advanced Micro Devices, Inc., Sunnyvale, Calif.

[21] Appl. No.: 356,766

[22] Filed: Dec. 15, 1994

[51] Int. Cl.[6] .................................................. H01L 21/336
[52] U.S. Cl. .................. 437/41; 437/44; 437/57
[58] Field of Search .................. 437/41, 44, 45, 437/57, 41 RLD, 41 AS; 257/344, 336

[56] References Cited

U.S. PATENT DOCUMENTS

| 4,318,216 | 3/1982 | Hsu | 437/44 |
|---|---|---|---|
| 4,597,827 | 7/1986 | Nishitani et al. | 437/44 |
| 4,965,213 | 10/1990 | Blake | 437/21 |
| 5,144,390 | 9/1992 | Matloubian | 257/344 |
| 5,286,664 | 2/1994 | Horiuchi | 437/44 |
| 5,409,853 | 4/1995 | Yu | 437/41 |
| 5,432,366 | 7/1995 | Banerjee et al. | 257/327 |

FOREIGN PATENT DOCUMENTS

| 1-186676 | 7/1989 | Japan | 257/344 |
|---|---|---|---|
| 1-212470 | 8/1989 | Japan | 257/344 |
| 5-129325 | 5/1993 | Japan | 257/344 |
| 2277406 | 10/1994 | United Kingdom | 257/336 |

OTHER PUBLICATIONS

Buti, T., et al., "Asymmetric Halo Source GOLD Drain (HS–GOLD) Deep Sub–half Micron n–MOSFET Design for Reliability and Performance", International Electron Devices Meeting (IEDM) Technical Digest, Jul. 1989, pp. 617–620.

Horiuchi, T., et al., "An Asymmetric Sidewall Process for High Performance LDD MOSFET's", IEEE Transactions on Electron Devices, vol. 41, No. 2, pp. 186–189, Feb. 1994.

Primary Examiner—T. N. Quach
Attorney, Agent, or Firm—Skjerven, Morrill MacPherson, Franklin & Friel

[57] ABSTRACT

A method of fabricating a true-LDD MOS transistor is described. The fabrication method includes the step of forming an LDD photoresist mask layer on a semiconductor substrate. The mask is aligned to the gate structure and extended to cover a source region, a lightly doped ion implant is performed in the drain region which is self-aligned with the gate structure and the LDD photoresist mask is removed. Spacers are then formed on the source side and the drain side of the gate structure and a heavily doped ion implant is applied to dope the source region and the drain region which are self-aligned with the gate structure and spacers.

13 Claims, 10 Drawing Sheets

METHOD FOR FABRICATING TRUE LDD DEVICES IN A MOS TECHNOLOGY

FIELD OF THE INVENTION

This invention relates to the field of MOS technology devices, particularly MOS technology devices which employ lightly doped drain (LDD) structures. More specifically, this invention describes a new method of forming asymmetric LDD structures.

BACKGROUND OF THE INVENTION

The maximum electric field $E_M$, in a MOSFET arises near the drain when the device is operating in a saturated condition. $E_M$ is greatly increased as device dimensions are reduced. These high electric fields cause electrons in the channel to gain kinetic energy and become "hot" since the energy distribution of the electrons is shifted to a higher value than that of the electrons which are in thermal equilibrium with the lattice. The electrons generally become hot in the vicinity of the drain edge of the channel where the $E_M$ arises. Hot electrons are damaging to device performance since such electrons can lose energy by impact ionization which generates electron-hole pairs. Electron-hole pair generation can lead to a form of avalanche breakdown. In addition, the hot holes and electrons can overcome the potential energy barrier between silicon substrate and a silicon dioxide layer overlying the substrate, thereby causing hot carriers to become injected into the gate oxide. Problems arising from hot carrier injection into the gate oxide include generation of a gate current, generation of a positive trapped charge which can permanently increase the threshold voltage ($V_T$) of the transistor. These problems are manifest as a decrease in saturation current, decrease of the transistor transconductance and a continual reduction in device performance caused by trapped charge accumulation.

Thus, hot-carrier effects cause unacceptable performance degradation in MOS devices built with conventional drain structures when channel lengths are short. To remedy this problem, alternative drain structures such as lightly doped drain (LDD) structures have been developed. Lightly doped drains absorb some of the potential energy into the drain and thus reduce $E_M$.

In the typical LDD structure, the drain is formed by two implants. One implant is self-aligned to the gate electrode. A second implant is self-aligned to the gate electrode on which two oxide sidewall spacers are formed. The purpose of the lightly doped first implant is to form a lightly doped section of the drain at the edge near the channel. The value of $E_M$ is reduced by about thirty to forty percent using this structure because the voltage drop is shared by the drain and the channel. In a typical non-LDD drain structure, almost the entire voltage drop occurs across the lightly doped channel region. The heavier second dose forms a low resistivity region of the drain, which is merged with the lightly doped region. Since the heavier dose is removed from the channel in an LDD structure than in a conventional structure, the heavily doped region of the drain can be made deeper without impacting device operation. The increased junction depth lowers the sheet resistance and the contact resistance of the drain.

A disadvantage of an LDD structure is an increased parasitic resistance of the source and drain regions caused by the lightly doped regions of the drain. The increased parasitic resistance causes a greater power dissipation for a constant applied voltage.

Further improvements in transistor reliability and performance for exceedingly smaller devices are achieved by transistors having an asymmetric LDD structure. Parasitic resistance at the source side of an LDD structure transistor induces a serious decrease in drain current. The reduced drain current is explained by an effective gate voltage drop from self-biased negative feedback. On the drain side of the transistor, drain current is not appreciably affected by the drain side parasitic resistance when the transistor is operating in the saturation region. Therefore, it is important to form the source and drain LDD structures separately, having a lightly doped drain region but no LDD structure in the source region, to achieve high-performance MOSFET operation.

One method for fabricating a transistor having an asymmetric LDD structure is taught by T. N. Buti et al in "Asymmetric Halo Source GOLD drain (HS-GOLD) Deep Sub-half Micron n-MOSFET Design for Reliability and Performance", International Electron Devices Meeting (IEDM) Technical Digest, p. 617, 1989. In this method, large-tilt implantation is used to form a gate-overlapped LDD region at the drain electrode alone. A halo (punch through stopper) is used at the source, but not at the drain. A disadvantage of this method is that a large-tilt implant is required, which greatly increases manufacturing complexity. In addition, to form many LDD structure transistors on a silicon wafer, multiple large-tilt implants are performed at various wafer orientations, further increasing manufacturing complexity and costs.

Another method for fabricating a transistor having an asymmetric LDD structure is disclosed by T. Horiuchi et al in "An Asymmetric Sidewall Process for High Performance LDD MOSFET's", IEEE Transactions on Electron Devices, Vol. 41, No. 2, p. 186, February 1994. Using this method an asymmetric LDD sidewall spacer technology achieves a high drivability LDD MOSFET without sacrificing hot carrier immunity. The asymmetric spacer is fabricated using a selective oxide deposition technique in which oxide is selectively deposited by a nonstandard liquid phase oxide deposition (LPD) process at the surface of the oxide and polysilicon surface. Then, a sidewall is formed by reactive ion etching. This technique is a standard process except for the unconventional LDD sidewall formation process. It is disadvantageous and costly to utilize a nonstandard process step.

SUMMARY OF THE INVENTION

In accordance with the present invention, a method of fabricating a true-LDD MOS transistor is described. The transistor is formed within a transistor structure which includes a transistor region in a semiconductor substrate, a gate structure overlying the transistor region, a source region of the transistor region flanking the gate structure on a first side, and a drain region of the transistor region blanking the gate structure on a second side opposite to the first side. The fabrication method includes the step of forming an LDD photoresist mask layer on the semiconductor substrate. The mask is aligned to the gate structure and extends to cover the source region. The method also includes the steps of implanting a lightly doped ion implant in the drain region which is self-aligned with the gate structure and removing the LDD photoresist mask. Spacers are then formed on the source side and the drain side of the gate structure and a heavily doped ion implant dopes the source region and the drain region which are self-aligned with the gate structure and spacers.

Using this method, optional steps are performed subsequent to implanting the lightly doped drain and removing the LDD photoresist mask but prior to formation of spacers includes the step of forming a source-only photoresist mask layer on the semiconductor substrate. The source-only mask is aligned to the gate structure and extends to cover the source region. A heavily doped ion implant is applied to dope the source region which is self-aligned with the gate structure.

The fabrication method of the present invention as described above has several advantages. One advantage is that only standard CMOS process steps are utilized. A second advantage is that large-tilt implants are avoided.

DETAILED DESCRIPTION

Figure 1:
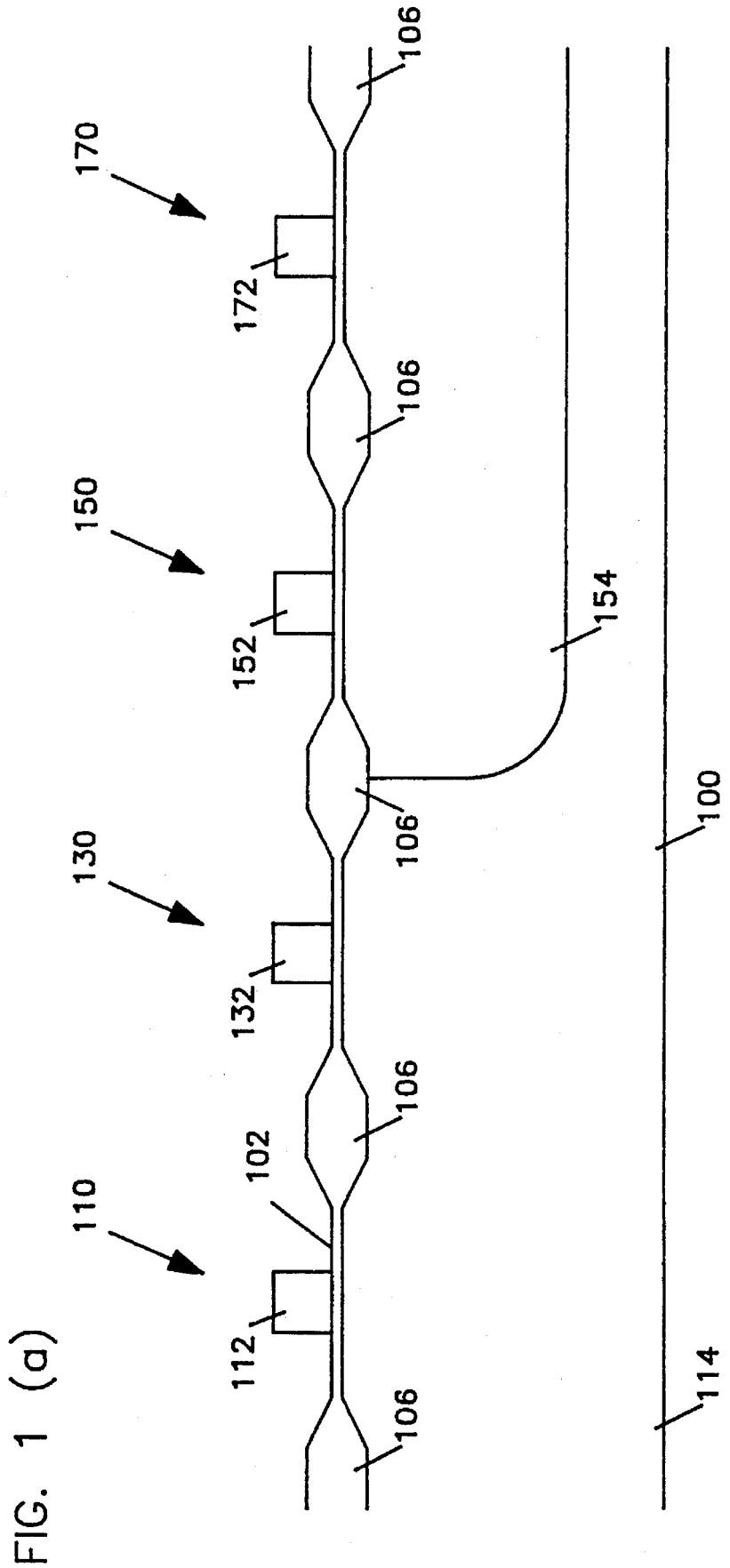
FIGS. 1(a) through 1(j) depict a process flow for fabricating CMOS transistors in an integrated circuit device in accordance with one embodiment of this invention.
Figure 1:
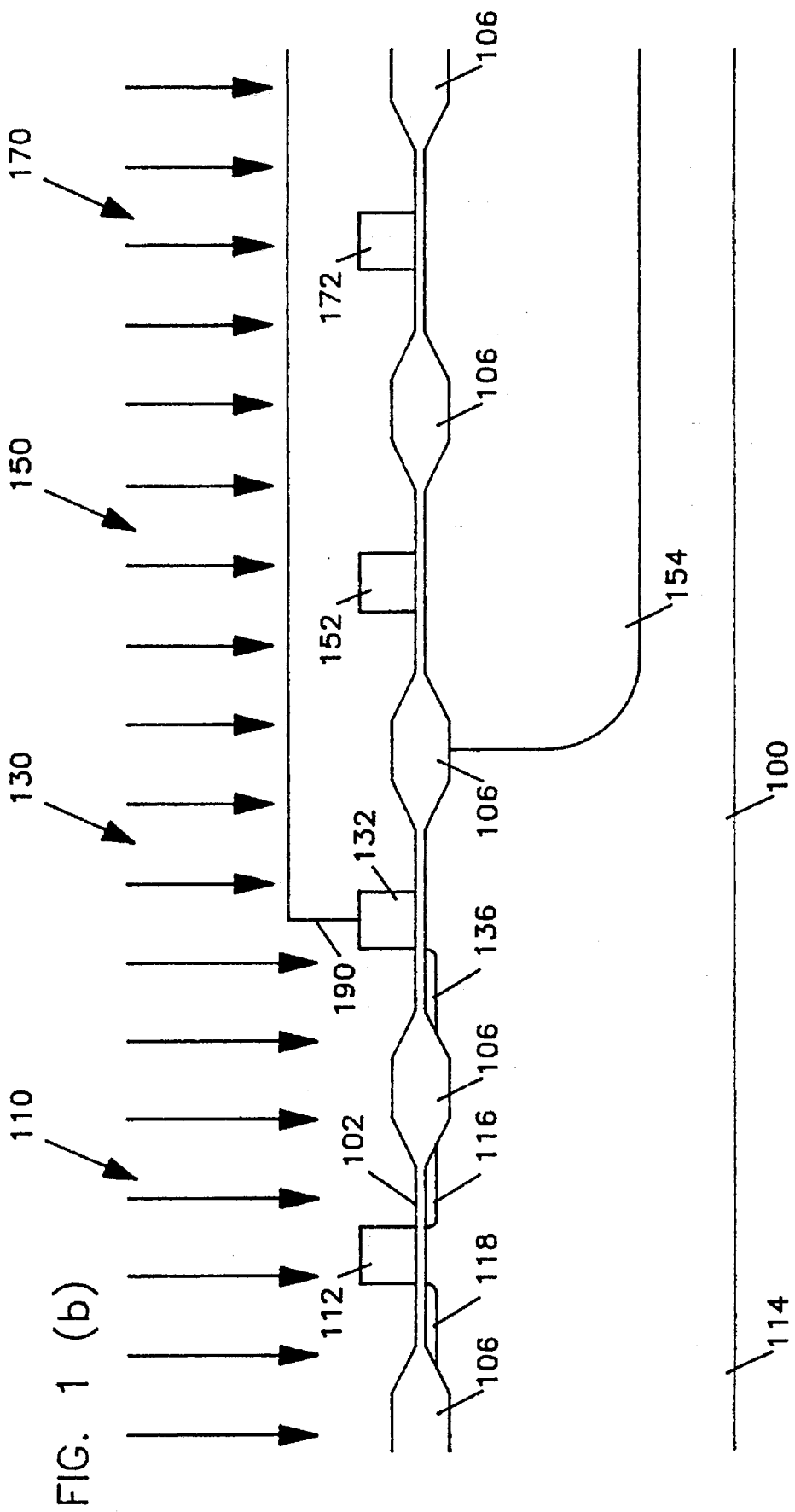
Figure 1:
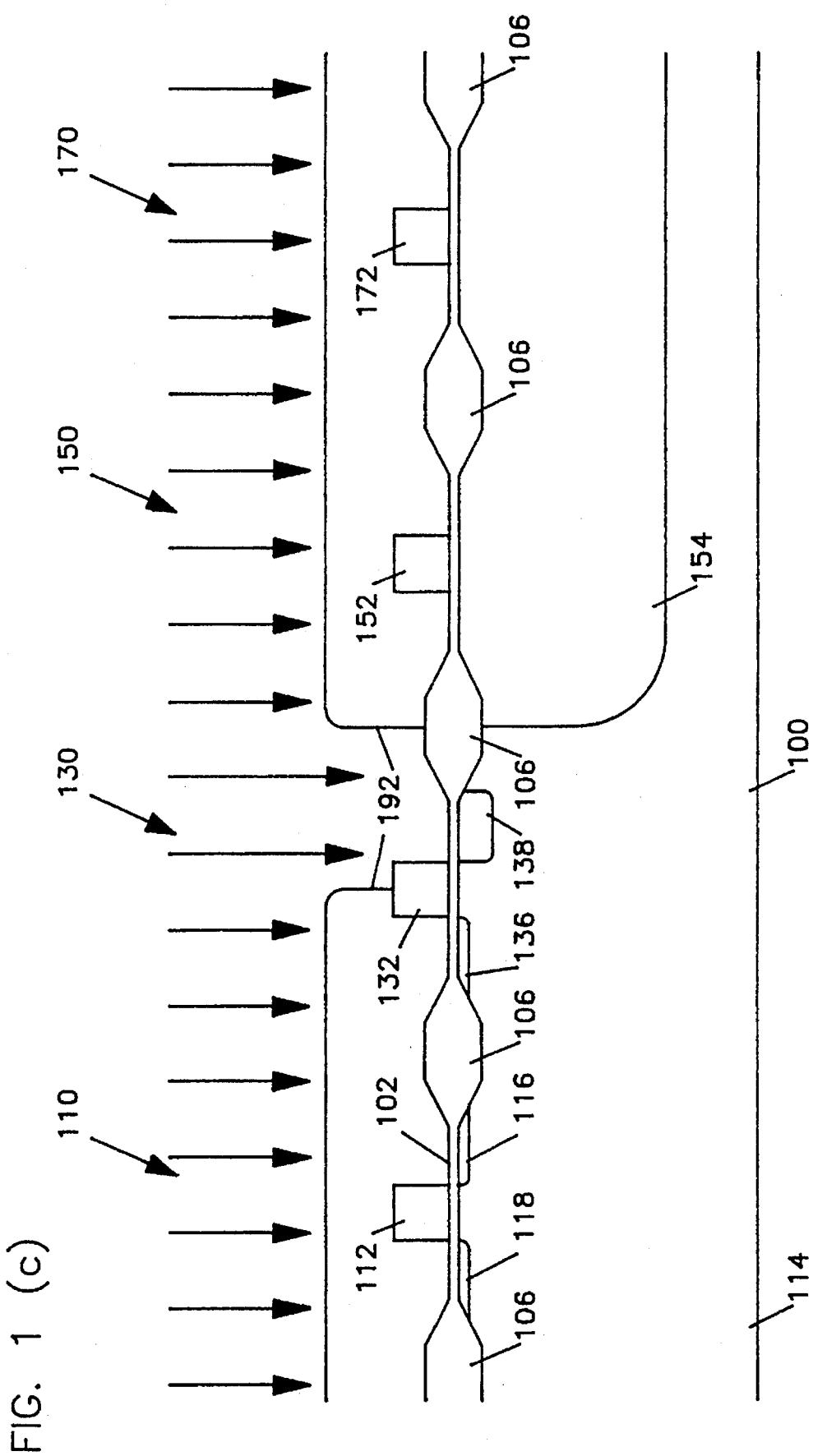
Figure 1:
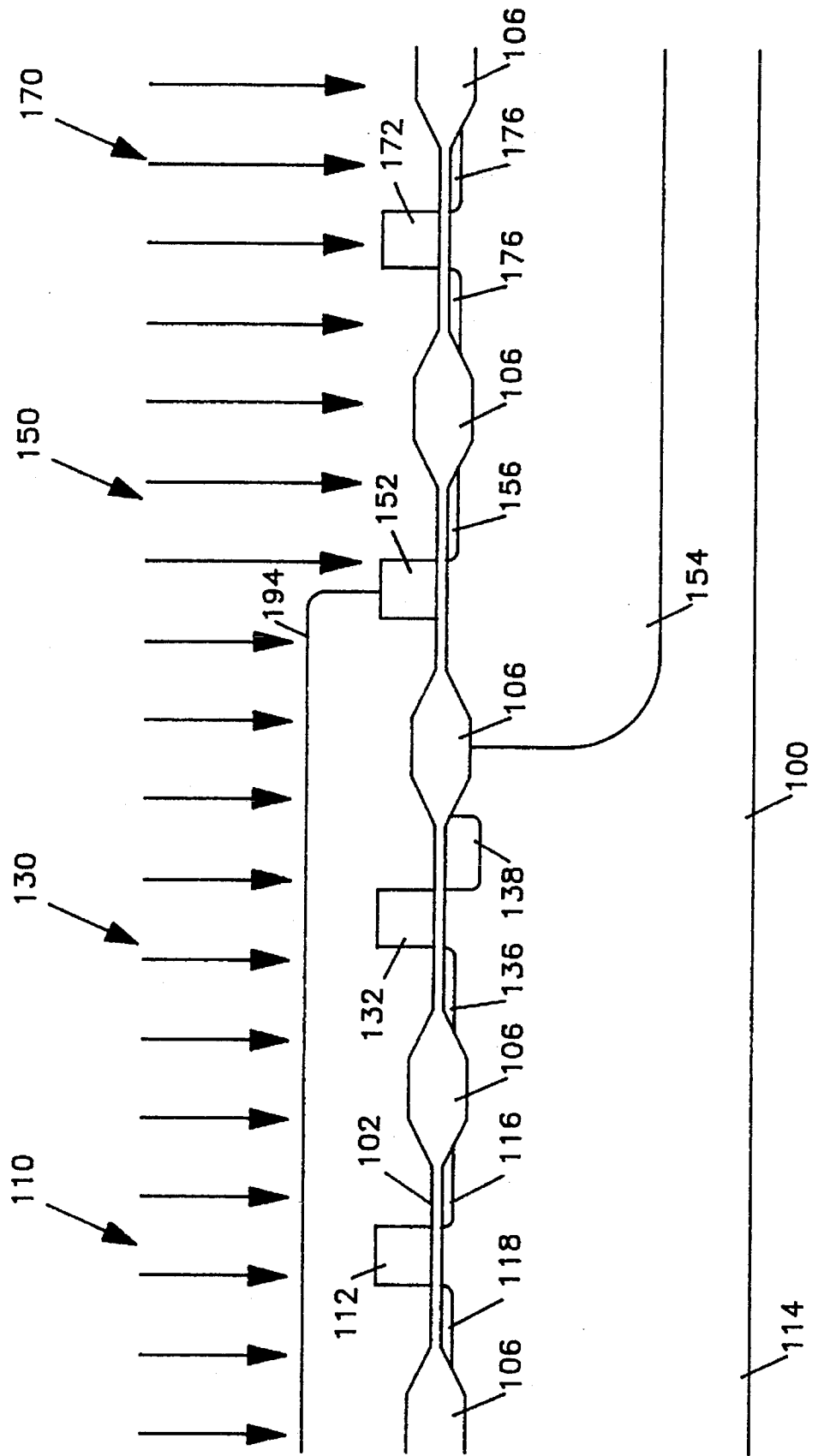
Figure 1:
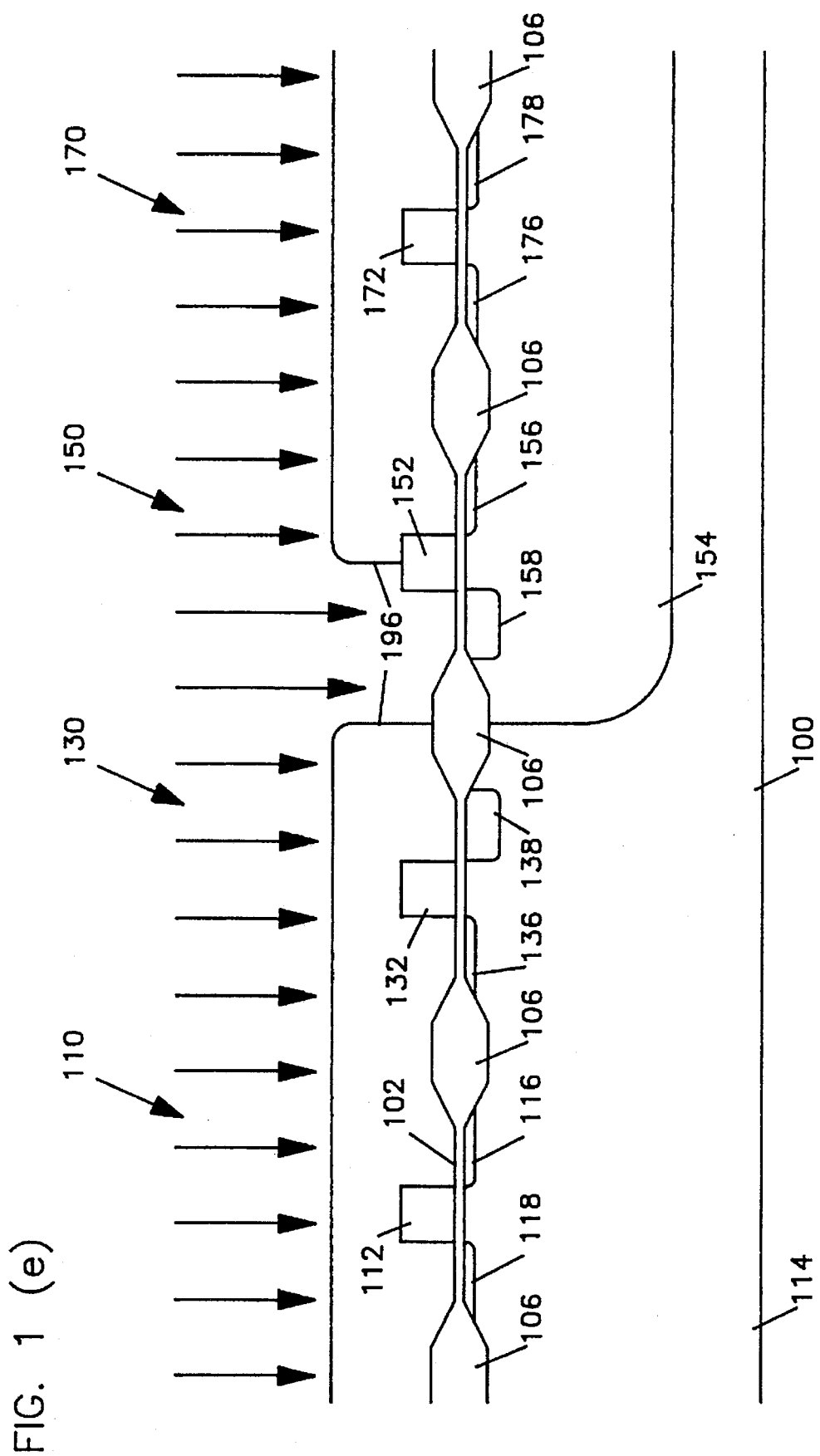
Figure 1:
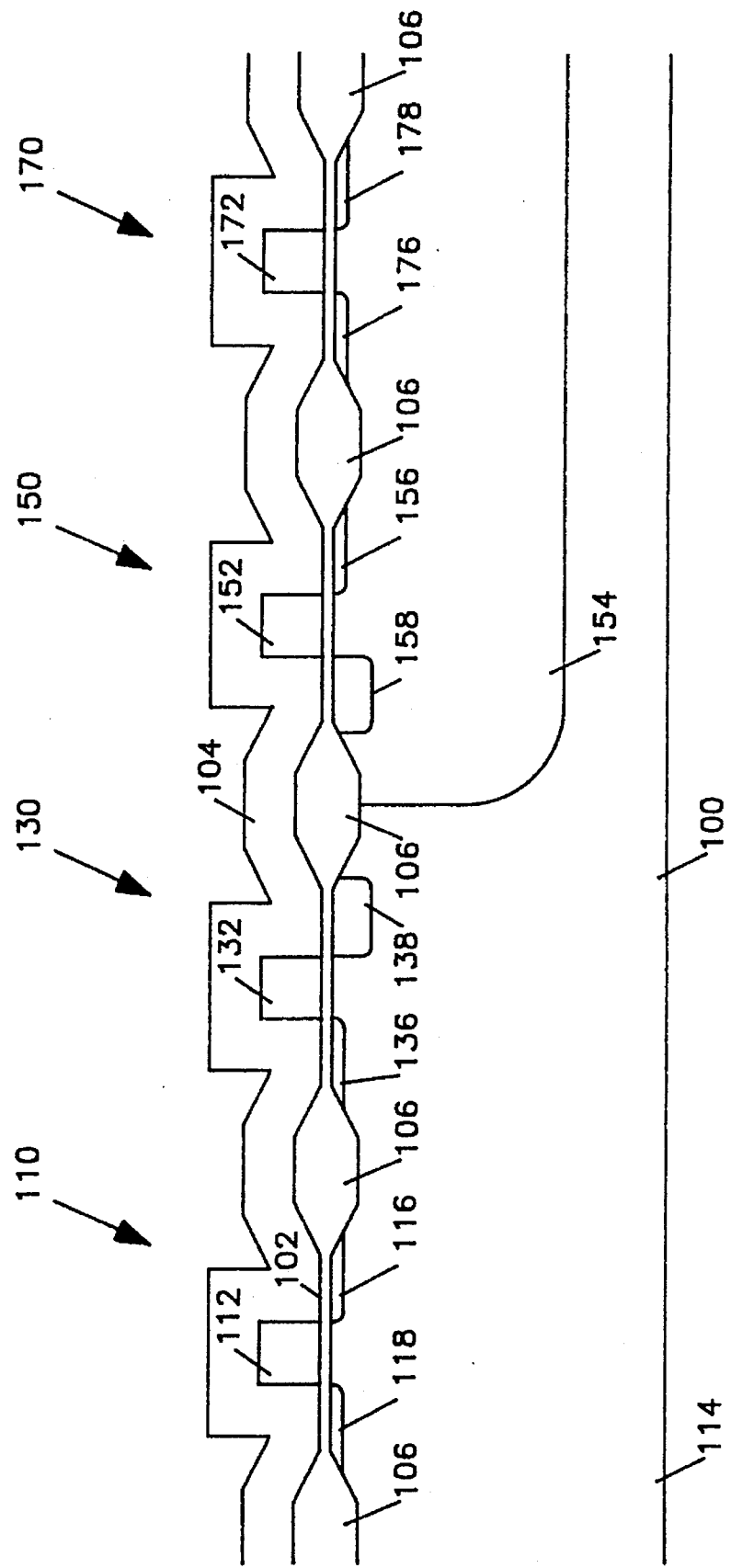
Figure 1:
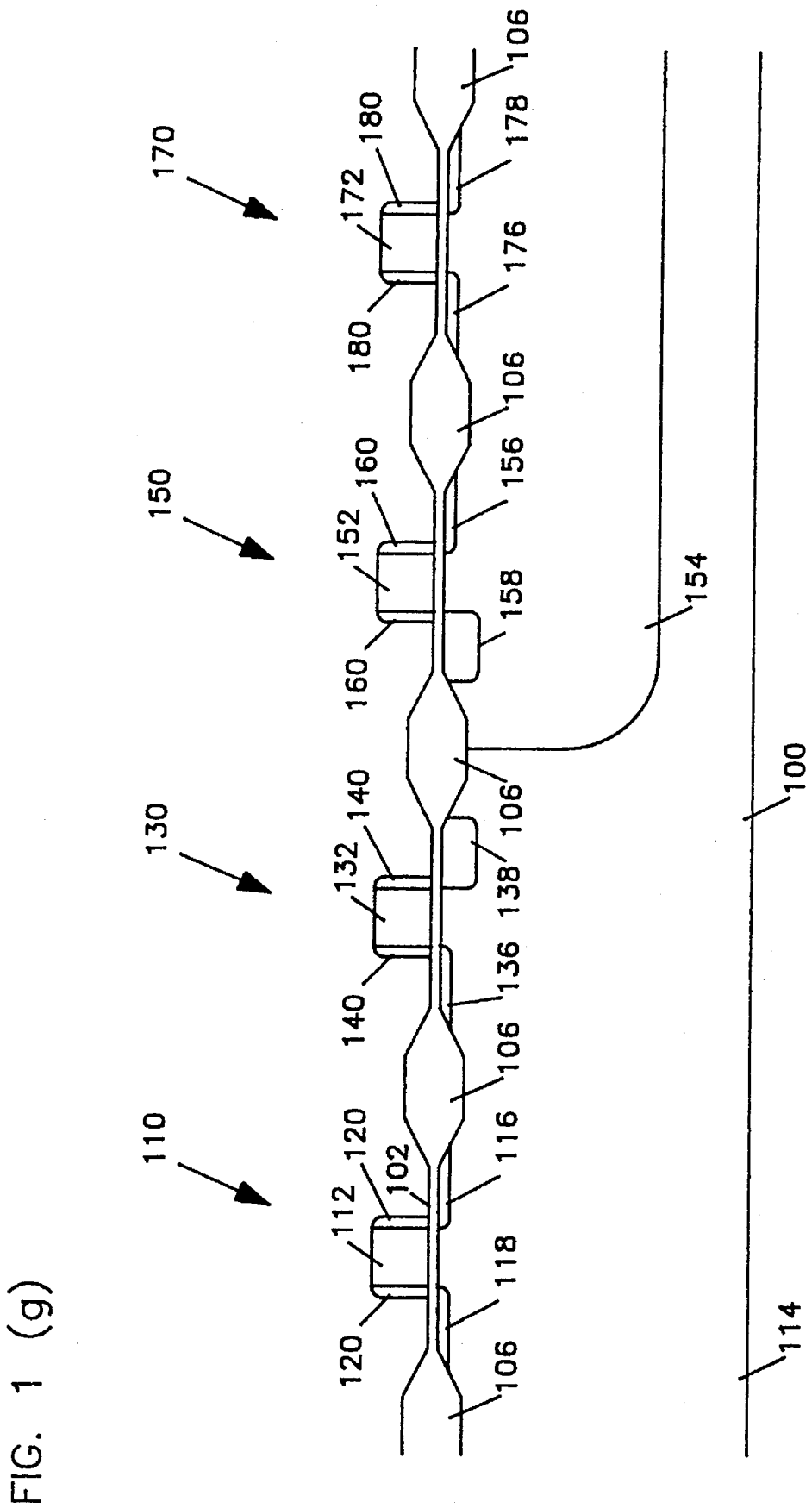
Figure 1:
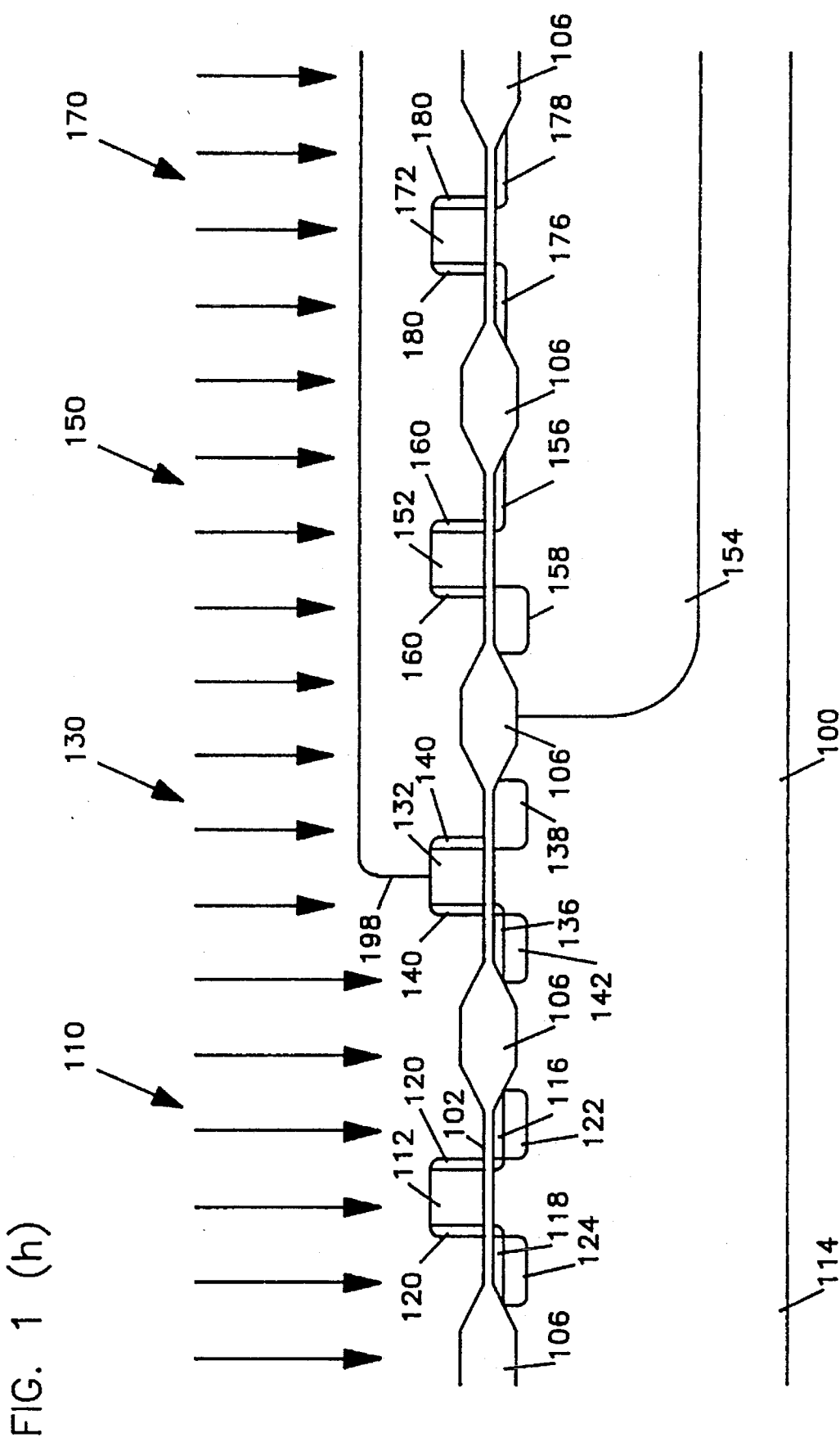
Figure 1:
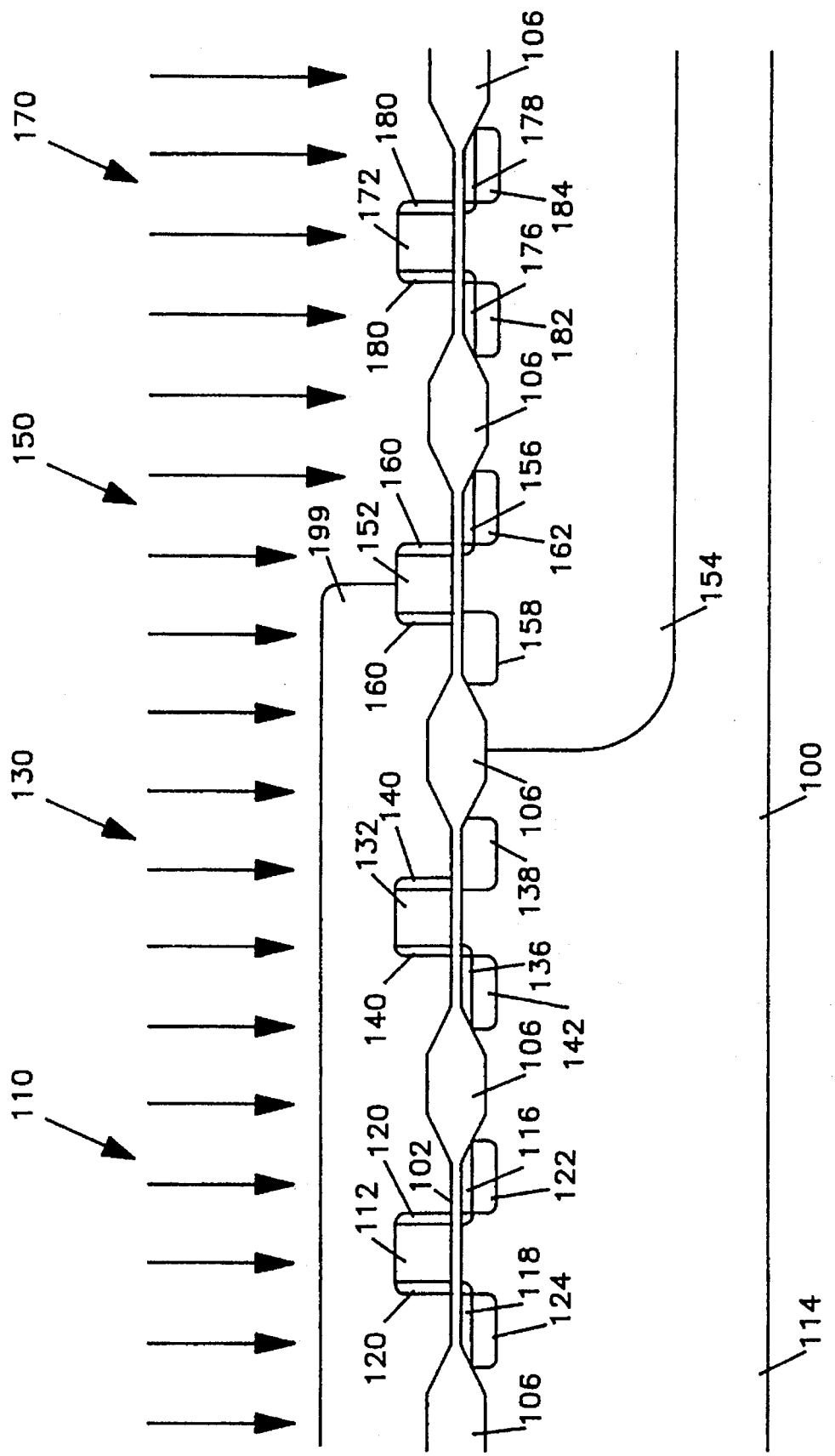
Figure 1:
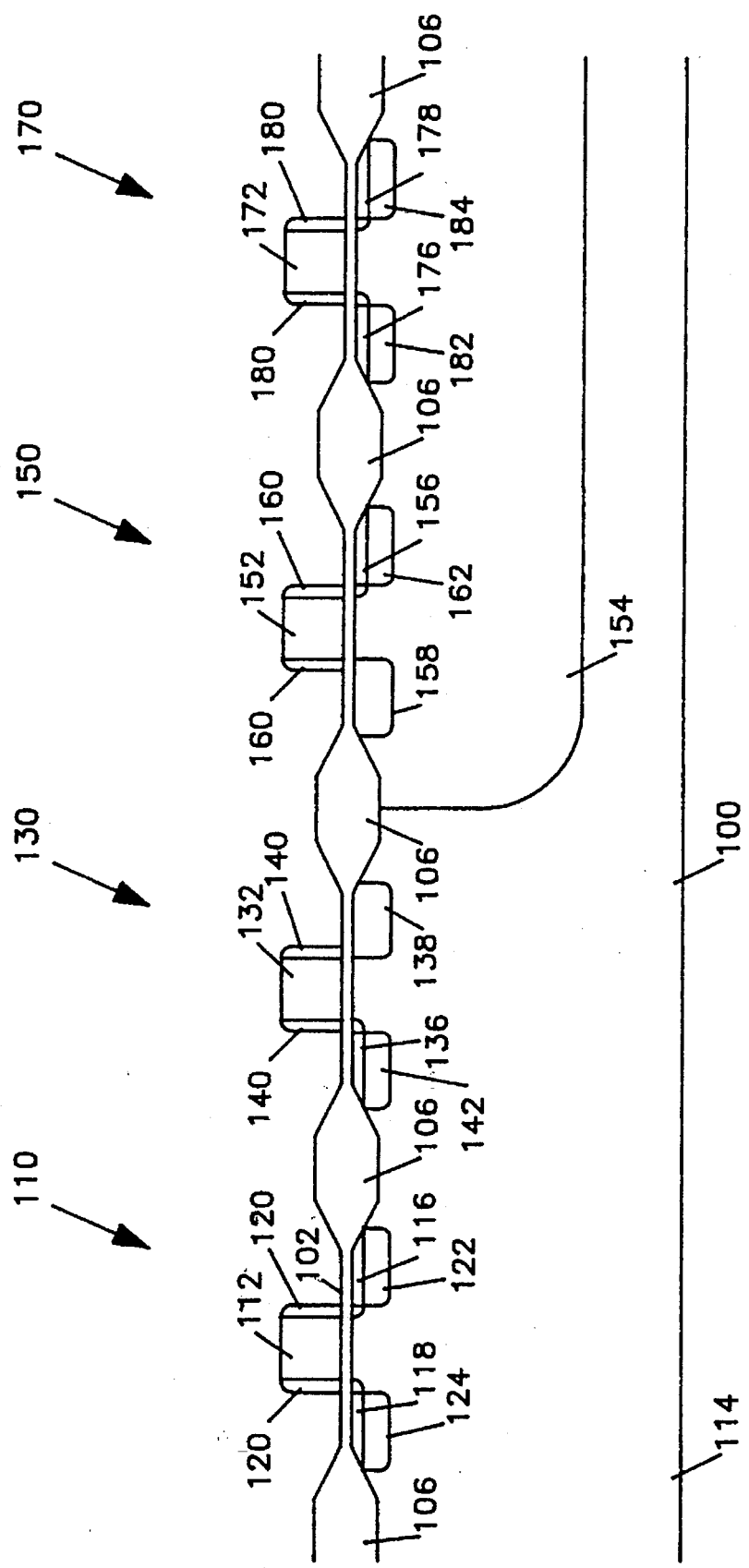

FIGS. 1(a) through 1(j) illustrate an embodiment of a method for fabricating CMOS transistors employing asymmetric LDD structures. In FIG. 1(a), two N-channel transistors 110 and 130 and two P-channel transistors 150 and 170 in a silicon wafer 100 are implemented using a P-well technology. The embodied method is also applicable to integrated circuit devices employing an N-well or twin-tub technologies. The starting material is a silicon wafer 110. Typically, the silicon wafer 100 is a lightly doped <100> wafer or a heavily doped <100> wafer with a lightly doped epitaxial layer at the surface. The P-channel transistors 150 and 170 are fabricated in an N-doped substrate 154 which is formed in a typical manner using N-well or twin-tub technologies as a somewhat heavily doped N-well structure. The N-doped substrate employed using a P-well technology is a lightly doped N-substrate. Similarly, the N-channel transistors 110 and 130 are fabricated in a P-doped substrate 114 which is formed in a typical manner as either lightly doped P-substrate or a more heavily doped P-well structure. Well structures are formed in a conventional manner by growing a thermal oxide layer, depositing a CVD nitride film, applying a mask which generally protects the silicon surface but exposes the well areas, and implanting ions into the well areas. Well ions are driven into the silicon by high temperature cycling while an oxide layer is grown in the well areas. A $V_T$ threshold-adjust implant is applied. The surface of the silicon wafer 100 is stripped of the oxide and nitride/oxide layers and a new pad-oxide/nitride layer for forming isolation structures is formed. A mask is applied to pattern the pad-oxide/nitride layer to define active device regions including the N-doped substrate region 154 and the P-doped substrate region 114 and to define field regions. Field oxide is then grown to form field oxide regions such as regions 106 for isolating active device regions. The nitride/oxide layer is then removed from the active device regions. A gate oxide layer 102 is grown overlying the surface of the silicon wafer 100. A polysilicon gate layer is deposited by chemical vapor deposition (CVD) and a mask is applied to pattern the polysilicon into gate structures 112, 132, 152 and 172.

FIG. 1(a) shows the silicon wafer 100 after formation of gate structures but prior to source, drain and LDD ion implantation. Polysilicon gates 112 and 132 of the respective N-channel transistors 110 and 130 are formed overlying a region of P-doped substrate 114. Polysilicon gates 112 and 132 of the respective N-channel transistors 110 and 130 are formed overlying a region of P-doped substrate 114. Polysilicon gates 152 and 172 of the respective P-channel transistors 150 and 170 are formed overlying a region of N-doped substrate 154. Polysilicon gates 150 and 172 of the respective P-channel transistors 150 and 170 are formed overlying a region of N-doped substrate 154. All of the steps of the CMOS fabrication process up to and including the step of forming the gate structures are typical CMOS fabrication steps.

In a first masking step and a first ion implant step, shown in FIG. 1(b), an N– LDD photoresist mask 190 is applied and N– ions are implanted to form N-channel transistor LDD regions 116 and 118 of N-channel transistor 110 which is a conventional symmetric LDD structure N-channel transistor. LDD regions 116 and 118 are self-aligned with the polysilicon gate 112. Also in this first masking step and first ion implant step, N– ions are implanted to form N-channel transistor LDD region 136 of N-channel transistor 130. N-channel transistor 130, when completed, has an asymmetric LDD structure. An asymmetric LDD structure is also called a "true" lightly doped drain structure since only the drain region is lightly doped. No light doping of N-channel source regions takes place. The N-LDD photoresist mask 190 is patterned to cover all regions of P-channel transistors and to cover the source regions of true-LDD P-channel transistors. Drain regions of N-channel LDD transistors are left exposed, as are source regions of conventional N-channel LDD transistors. The N– LDD photoresist mask 190 is finely aligned with the gate mask of True-LDD transistors within an error of 0.15μ for transistors with approximately a 0.4μ gate length, for example. This alignment accuracy is satisfied by commercially available stepper systems.

The step of applying the N– LDD photoresist mask 190 is also performed in a conventional LDD process to prevent implanting N– ions in P-channel transistor regions. However, this step differs from the conventional step in that N-channel transistor source regions are covered and therefore not implanted with N-ions. This difference is achieved merely by an alteration in the pattern of the photoresist mask and not by an additional mask and implant step.

Typically, phosphorus or arsenic N-type ions are implanted in the N– LDD implant step. Lightly doped drain junctions are formed to reduce hot-carrier generation during the lifetime of the transistor.

The N– LDD photoresist mask 190 is stripped and, in a second masking step and a second ion implant step shown in FIG. 1(c), a N+ source-only photoresist mask 192 is applied and N+ ions are implanted to form a source region 138 of the true-LDD N-channel transistor 130. Source region 138 is self-aligned with the polysilicon gate 132. The N+ source-only photoresist mask 192 is patterned to cover all regions of P-channel transistors, all regions of conventional symmetric LDD structure N-channel transistors, and to cover the drain regions of true-LDD N-channel transistors. Only source regions of N-channel LDD transistors are left exposed. The N+ source-only LDD photoresist mask 192, like mask 190, is finely aligned with the gate mask of True-LDD transistors. However, N+ source-only LDD photoresist mask 192 exposes the transistor source region rather than the drain region. Application of the N+ source-only photoresist mask 192 and N+ ion implantation are additional process steps which are not performed in a conventional CMOS LDD process. Generally, arsenic N-type ions are implanted in the N+ source-only implant step.

Similarly, the N+ source-only LDD photoresist mask 192 is stripped. In a third masking step and a third ion implant step, shown in FIG. 1(d), a P– LDD photoresist mask 194 is applied and P– ions are implanted to form P-channel transistor LDD regions 176 and 178 of P-channel transistor 170 which is a conventional symmetric LDD structure P-channel transistor. LDD regions 176 and 178 are self-aligned with the polysilicon gate 172. Similarly, during this implant step, P– ions are implanted to form P-channel transistor LDD region 156 of P-channel transistor 150. P-channel transistor 150 is configured to form an asymmetric, or true LDD structure. The P– LDD photoresist mask 194 is patterned to cover all regions of N-channel transistors and to cover the source regions of true-LDD P-channel transistors. Drain regions of P-channel LDD transistors are left exposed, as are source regions of conventional P-channel LDD transistors. The P– LDD photoresist mask 194 is finely aligned with the gate mask of True-LDD transistors. The step of applying the P– LDD photoresist mask 194 is also performed in a conventional LDD process to prevent implanting P– ions in N-channel transistor regions in a step which differs from the conventional step only in that P-channel transistor source regions are protected from implantation of P– ions, an alteration in the photoresist mask pattern but not an additional mask and implant step. Typically, boron or $BF_2$ P-type ions are implanted in the P– LDD implant step.

The P– LDD photoresist mask 194 is removed and a fourth masking step and a fourth ion implant step, shown in FIG. 1(e), are performed. A P+ source-only photoresist mask 196 is applied and P+ ions are implanted to form a source region 158 of the true-LDD P-channel transistor 150. Source region 158 is self-aligned with the polysilicon gate 152. The P+ source-only photoresist mask 196 covers all regions of N-channel transistors, all regions of conventional symmetric LDD structure P-channel transistors, and to cover the drain regions of true-LDD P-channel transistors. Only source regions of P-channel LDD transistors are left exposed. The P+ source-only LDD photoresist mask 196 is finely aligned with the gate mask of True-LDD P-channel transistors. However, P+ source-only LDD photoresist mask 196 exposes the transistor source region rather than the drain region. P+ source-only photoresist mask 196 application and P+ ion implantation are additional process steps to a conventional CMOS LDD process. Generally, boron or $BF_2$ P-type ions are implanted in the P+ source-only implant step.

The P+ source-only photoresist mask 196 is removed and a layer of spacer oxide 104, shown in FIG. 1(f), is deposited overlying the silicon wafer 100, the polysilicon gates 112, 132, 152 and 172. A suitable thickness of the spacer oxide layer 104 ranges from approximately 1000Å to 2000Å. Adjacent to the lateral sides of the polysilicon gates 112, 132, 152 and 172, spacer oxide is deposited to a thickness which is increased by approximately the thickness of the gates. Referring to FIG. 1(g), the spacer oxide layer 104 is etched to form spacers 120 on the sides of polysilicon gate 112, spacers 140 on the sides of gate 132, spacers 160 on the sides of gate 152, and spacers 180 on the sides of gate 172. An anisotropic dry etching process is typically used to form spacers since a preferable spacer form is achieved using a controlled anisotropic etch. Spacers are utilized to form the usual source and drain implants at a controlled distance removed from the edge of gate polysilicon. This spacing increases series resistance of the transistor.

In a fifth masking step and a fifth ion implant step, shown in FIG. 1(h), a N+ source/drain photoresist mask 198 is applied and N+ ions are implanted to form a source region 122 and a drain region 124 of symmetric LDD structure N-channel transistor 110. Source region 122 and drain region 124 are self-aligned with the polysilicon gate 112 and spacers 120. Similarly, the N+ source/drain photoresist mask 198 forms a drain region 142 of true-LDD N-channel transistor 130. Drain region 142 is self-aligned with the polysilicon gate 132 and spacers 140. The N+ ion implant is typically an arsenic ion implant and the implant energy for implanting As+ ions typically ranges from 40 KeV to 80 KeV.

The N+ source/drain photoresist mask 198 is stripped and, in a corresponding sixth masking step and a sixth ion implant step, shown in FIG. 1(i), a P+ source/drain photoresist mask 199 is applied and P+ ions are implanted to form a source region 182 and a drain region 184 of symmetric LDD structure P-channel transistor 170. Source region 182 and drain region 184 are self-aligned with the polysilicon gate 172 and spacers 180. The P+ source/drain photoresist mask 199 forms a drain region 162 of true-LDD P-channel transistor 150. Drain region 162 is self-aligned with the polysilicon gate 152 and spacers 160. The implant energy for implanting $BF_2$+ ions typically ranges from 40 KeV to 80 KeV.

The P+ source/drain photoresist mask 199 is removed so that a final form of the silicon wafer 100, shown in FIG. 1(j), includes conventional LDD N-channel transistor 110, true LDD N-channel transistor 130, true LDD P-channel transistor 150 and conventional LDD P-channel transistor 170. Thus, the illustrative method provides for fabrication of all four types of LDD transistors using a CMOS process which utilizes only two masking and ion implant steps which are additional to the typical steps for forming conventional LDD transistors. The illustrative process, like a conventional process, includes additional surface processing operations to form contact layers, interconnects, passivation structures and the like, as are known in the art of integrated circuit fabrication.

The description of the illustrative embodiment is intended to be illustrative and not limiting. Numerous other embodiments will be apparent to those skilled in the art, all of which are included within the broad scope of this invention. The apparatus and method according to this invention are not confined to a CMOS technology but also apply to NMOS and PMOS technologies. In particular for MOS technologies, the method is applicable to P-well, N-well and twin-tub CMOS technologies.

What is claimed is:

1. A method of fabricating a true-LDD MOS transistor in a transistor structure which includes a transistor region of a semiconductor substrate, a gate structure overlying the transistor region, a source region of the transistor region flanking the gate structure on a first side, and a drain region of the transistor region flanking the gate structure to a second side opposite to the first side, the method comprising the steps of:

forming an LDD photoresist mask layer on the semiconductor substrate, the mask having a boundary aligned to the gate structure and extending to cover the source region;

implanting a lightly doped ion implant in the drain region which is self-aligned with the gate structure;

removing the LDD photoresist mask;

forming a spacer on the source side and a spacer on the drain side of the gate structure;

implanting a heavily doped ion implant in the source region and the drain region which are self-aligned with the gate structure and spacers;

forming a source-only photoresist mask layer on the semiconductor substrate, the mask having a boundary aligned to the gate structure and extending to cover the drain region;

implanting a heavily doped ion implant in the source region which is self-aligned with the gate structure; and removing the source-only photoresist mask.

2. A method as in claim 1, wherein the steps of forming the source-only photoresist mask layer, implanting heavily doped ions in the source region and removing the source-only photoresist mask are performed subsequent to the LDD photoresist mask removing step and preceding the spacer forming step.

3. A method as in claim 1, wherein the gate structure is formed from polysilicon.

4. A method as in claim 1, wherein the spacers are formed from silicon dioxide.

5. A method as in claim 1, wherein the spacers are formed from silicon nitride.

6. A method as in claim 2, wherein the spacers are formed from polysilicon.

7. A method of fabricating a plurality of true-LDD CMOS transistors including a transistor of a first conductivity type and a transistor of a second conductivity type opposite to the first conductivity type, each transistor being formed in a transistor structure which includes a transistor region of a semiconductor substrate, a gate structure overlying the transistor region, a source region of the transistor region flanking the gate structure on a first side, and a drain region of the transistor region flanking the gate structure to a second side opposite to the first side, the method comprising the steps of:

forming a first-conductivity-type LDD photoresist mask layer on the semiconductor substrate, the mask having a boundary aligned to the gate structure of the first conductivity type transistor and extending to cover the source region of the first conductivity type transistor and extending to cover the entire transistor region of the second conductivity type transistor;

implanting a lightly doped ion implant in the first conductivity type transistor drain region which is self-aligned with the gate structure;

removing the first-conductivity-type LDD photoresist mask;

forming a second-conductivity-type LDD photoresist mask layer on the semiconductor substrate, the mask having a boundary aligned to the gate structure of the second conductivity type transistor and extending to cover the source region of the second conductivity type transistor and extending to cover the entire transistor region of the first conductivity type transistor;

implanting a lightly doped ion implant in the second conductivity type transistor drain region which is self-aligned with the gate structure;

removing the second-conductivity-type LDD photoresist mask;

forming spacers on the source sides and spacers on the drain sides of the gate structures;

forming a first-conductivity-type source/drain photoresist mask layer on the semiconductor substrate, the mask extending to cover the entire transistor region of the second conductivity type transistor;

implanting a first-conductivity-type heavily doped ion implant in the first-conductivity-type source and drain regions which are self-aligned with the gate structure and spacers;

forming a second-conductivity-type source/drain photoresist mask layer on the semiconductor substrate, the mask extending to cover the entire transistor region of the first conductivity type transistor; and implanting a second-conductivity-type heavily doped ion implant in the second-conductivity-type source and drain regions which are self-aligned with the gate structure and spacers.

8. A method as in claim 7, further comprising the steps of:

forming a first-conductivity-type source-only photoresist mask layer on the semiconductor substrate, the mask having a boundary aligned to the gate structure of the first conductivity type transistor and extending to cover the drain region of the first conductivity type transistor and extending to cover the entire transistor region of the second conductivity type transistor;

implanting a heavily doped ion implant in the first conductivity type transistor source region which is self-aligned with the gate structure;

removing the source-only photoresist mask;

forming a second-conductivity-type source-only photoresist mask layer on the semiconductor substrate, the mask having a boundary aligned to the gate structure of the second conductivity type transistor and extending to cover the drain region of the second conductivity type transistor and extending to cover the entire transistor region of the first conductivity type transistor;

implanting a heavily doped ion implant in the second conductivity type transistor source region which is self-aligned with the gate structure; and removing the source-only photoresist mask.

9. A method as in claim 8, wherein the steps of forming the source-only photoresist mask layer, implanting heavily doped ions in the source region and removing the source-only photoresist mask are performed subsequent to the LDD photoresist mask removing step and preceding the spacer forming step.

10. A method as in claim 7, wherein the gate structure is formed from polysilicon.

11. A method as in claim 7, wherein the spacers are formed from silicon dioxide.

12. A method as in claim 7, wherein the spacers are formed from silicon nitride.

13. A method as in claim 7, wherein the spacers are formed from polysilicon.

* * * * *

UNITED STATES PATENT AND TRADEMARK OFFICE
CERTIFICATE OF CORRECTION

PATENT NO.   : 5,580,804
DATED        : December 3, 1996
INVENTOR(S)  : Joh

It is certified that error appears in the above-identified patent and that said Letters Patent is hereby corrected as shown below:

Claim 6, col. 7, line 18, delete "2" and insert --1--.

Signed and Sealed this

Twenty-ninth Day of April, 1997

Attest:

BRUCE LEHMAN

*Attesting Officer*    Commissioner of Patents and Trademarks